US006766282B1

(12) United States Patent
Schettine

(10) Patent No.: US 6,766,282 B1
(45) Date of Patent: Jul. 20, 2004

(54) METHOD AND APPARATUS FOR STRUCTURE LAYOUT

(76) Inventor: Michael Schettine, 1077 Youngs Rd., Delanson, NY (US) 12053

( * ) Notice: Subject to any disclaimer, the term of this patent is extended or adjusted under 35 U.S.C. 154(b) by 0 days.

(21) Appl. No.: 09/551,681

(22) Filed: Apr. 18, 2000

(51) Int. Cl.[7] ........................... G06F 17/50; F04G 21/16
(52) U.S. Cl. ........................ 703/1; 52/741.1; 52/745.09
(58) Field of Search ............................ 703/1; 52/741.1, 52/745.09

(56) References Cited

U.S. PATENT DOCUMENTS

| | | | |
|---|---|---|---|
| 3,628,232 A | 12/1971 | Brewer | 29/407.1 |
| 3,785,060 A | 1/1974 | Brewer | 33/549 |
| 3,816,931 A | 6/1974 | LaMar | 33/563 |
| 4,367,590 A | 1/1983 | Winter et al. | 33/758 |
| 4,845,858 A | 7/1989 | Thomas | 33/759 |
| 5,195,249 A | 3/1993 | Jackson | 33/528 |
| 5,627,763 A | 5/1997 | Carlson | 703/1 |
| 5,724,246 A * | 3/1998 | Heil | 700/167 |
| 5,755,072 A | 5/1998 | Lingafelter | 52/741.1 |
| 5,819,498 A | 10/1998 | Geraci | 52/745.1 |

OTHER PUBLICATIONS

Newton, C. Simulated Site Visits. A 4D Multimedia Database for the Study of Architectural Construction, 1999 IEEE International Conference on Information Visualization, pp. 62–66.*

Boar, B.H. A Blueprint for Solving Problems in Your IT Architecture, IT Professional; vol. 1, Issue 6, Nov.–Dec. 1999, pp. 23–29.*

Huang et al., M. InterpretingImages of Architectural Drawings for Building Cost Estimation, Sixth International Conferece on Image Processing and Its Applications, vol. 1, 1997, pp. 126–130.*

Dosch et al., P. Reconstruction of the 3D Structure of a Building form the 2D Drawings of its Floors, Proceedings of the Fifth International Conference on Document Analysis and Recognition, ICDAR '99, 1999, pp. 487–490.*

Ding et al., C. A Framework for the Automated Drawing of Data Structure Diagrams, IEEE Transactions on Software Engineering, vol. 16, No. 5, May 1990, pp. 543–557.*

* cited by examiner

*Primary Examiner*—Russell Frejd
(74) *Attorney, Agent, or Firm*—Heslin Rothenberg Farley & Mesiti P.C.

(57) ABSTRACT

The present invention relates generally to structure layout and marking during construction. More particularly, the present invention relates to an automated layout system that acquires data directly from the architectural drawing, blueprint, or CAD (computer aided design). The automated layout system then generates a full banner for denoting the precise location of building elements such as studs, doors, windows, etc., for a structure under construction.

39 Claims, 13 Drawing Sheets

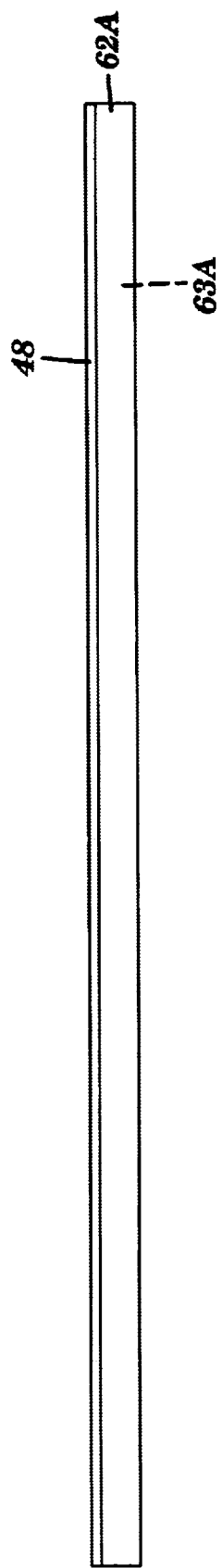
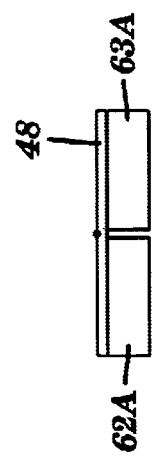
FIG. 4
FIG. 5

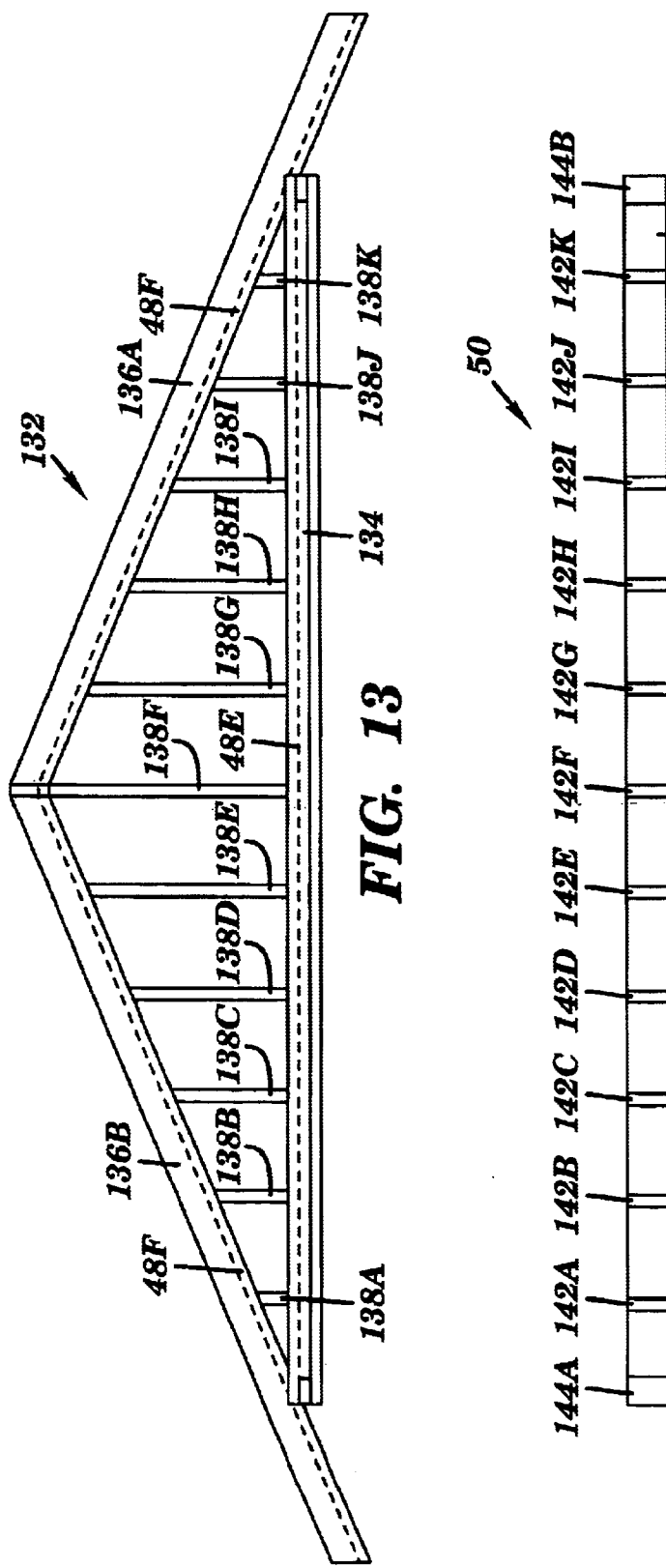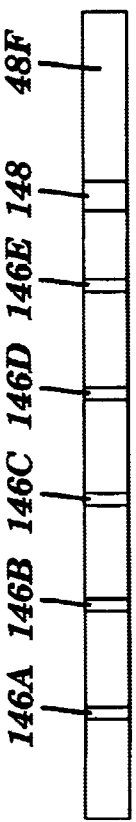

METHOD AND APPARATUS FOR STRUCTURE LAYOUT

FIELD OF THE INVENTION

The present invention relates generally to a structure layout and marking during construction. More particularly, the present invention relates to an automated layout system that acquires data directly from the architectural design (e.g., drawing, blueprint, or CAD (computer aided design)) to generate a template to locate the building elements of a structure.

BACKGROUND OF THE INVENTION

Generally building construction includes framing. In platform framing, which is used for most residential construction, the first floor is built on top of the foundation walls as though it were a platform. The floor 15 provides a base upon which the carpenter can assemble wall sections and then raise them into place. The wall sections may support a platform for the second floor where the wall sections and partitions are again built and erected. Each floor is framed separately. The roof is framed above the upper walls.

Typically, a carpenter must read a building blueprint to determine the dimensions for each wall. The carpenter then uses a flexible measuring tape to make manual measurements of distances along a structural member such as a top or bottom plate of a wall. Markings are manually applied to the structural member to locate the positions of various members such as studs, jack posts, cripples, etc. Additionally, the locations for doors and windows have to be manually marked.

The manual marking method is time consuming and requires a large number of measurements. The measurements may also require the assistance of another person. Measuring and marking errors may result in misplaced components such as doors or windows. These mistakes can result in costly construction delays involving reinstallation and rebuilding of structural elements.

SUMMARY OF THE INVENTION

The present invention provides an automated layout system that acquires data directly from the architectural design (e.g, drawing, blueprint, or CAD (computer aided design)). The automated layout system then generates a full size template, hereafter referred to as "banner," for denoting the precise location of building components such as studs, doors, windows, etc., for a building under construction.

The present invention in one embodiment generally provides an apparatus comprising:
  an input system for acquiring an architectural design of a structure;
  a processing system for converting the architectural design into a plurality of component locations of the static structure; and
  an output system for receiving at least one component location from the processing system and for outputting each component location.

The present invention provides a method comprising the steps of:
  providing an architectural design of a static structure;
  providing a computer aided design system for generating a digitized data file from the architectural design;
  providing a processing system for converting the digitized data file into a plurality of component locations of the structure; and
  marking the location for at least one component onto at least one banner.

The present invention in another embodiment comprises:
  a sheet of material;
  a plurality of marks on the sheet of material for indicating a location for at least one component, and wherein the plurality of marks are colored;
  a component identification number printed onto the sheet of material; and
  a list of dimensional information printed onto the sheet of material.

BRIEF DESCRIPTION OF THE DRAWINGS

The features of the present invention will best be understood from a detailed description of the invention and a preferred embodiment thereof selected for the purposes of illustration and shown in the accompanying drawings in which:

FIG. 4 illustrates a side view of the banner attached to the first reference component and the second reference component;

FIG. 5 illustrates an end view of the banner attached to the first reference component and the second reference component;

FIG. 13 illustrates a side view of a gable end;

FIG. 14 illustrates a plan view of a banner for a plate member of the gable end;

FIG. 15 illustrates a plan view of a banner for a gable rafter;

DETAILED DESCRIPTION OF THE INVENTION

Figure 1:
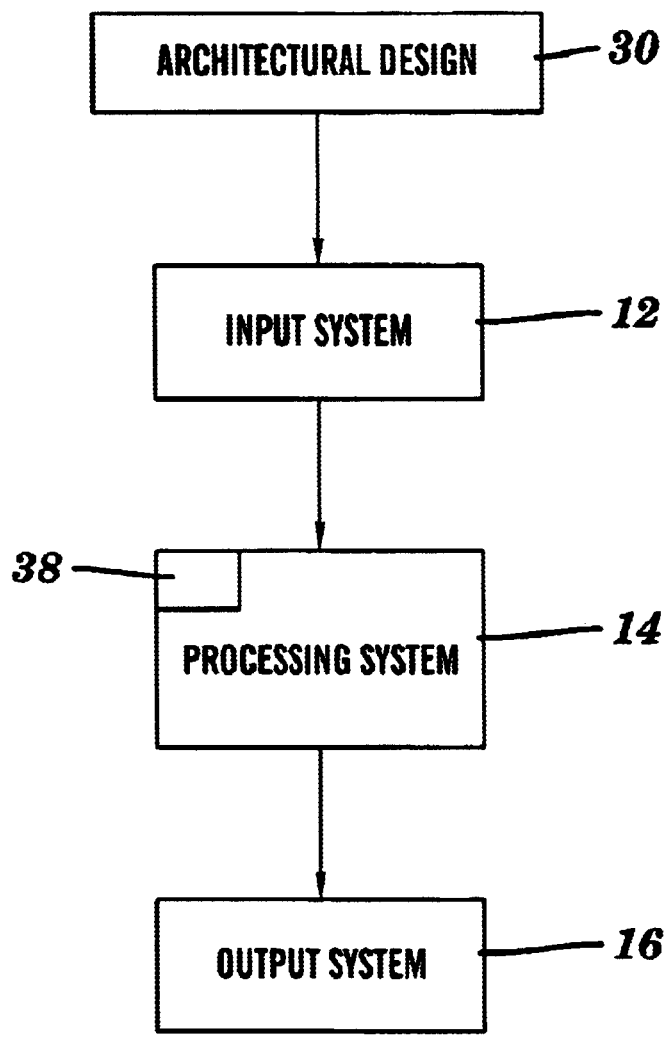
FIG. 1 illustrates a schematic apparatus view of an automated layout system.

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., which are disclosed simply as an example of the preferred embodiment. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

Figure 7:
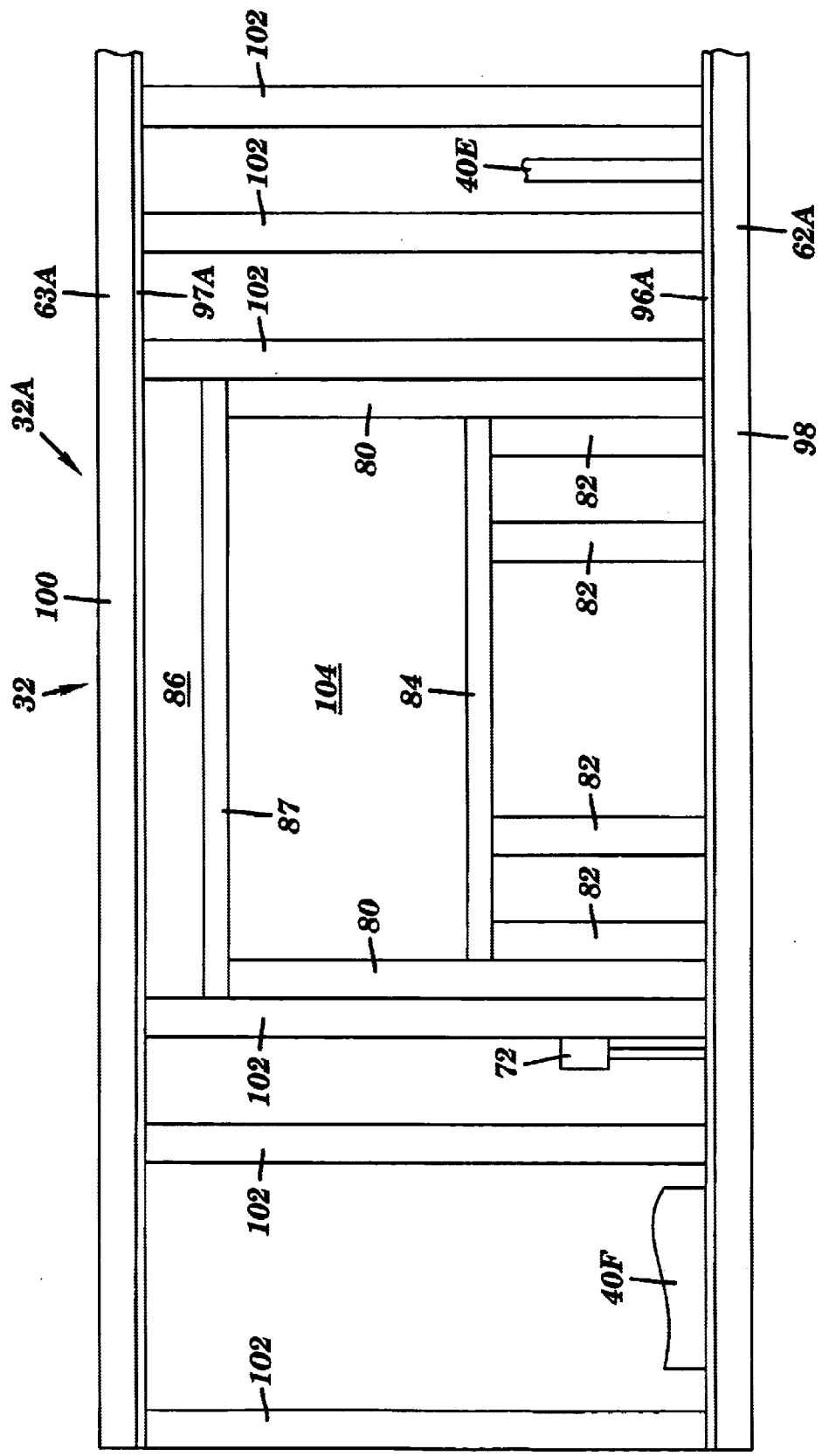
FIG. 7 illustrates a side view of a framed wall of the structure including an electrical component, a plumbing component, a heating, ventilation, or air conditioning component, and a window opening.

FIG. 1 illustrates a schematic apparatus view of an automated layout system 10. The automated layout system 10 includes an input system 12, a processing system 14, and an output system 16. The input system 12 acquires an architectural design 30 of a structure 32 (FIG. 7).

Figure 2:
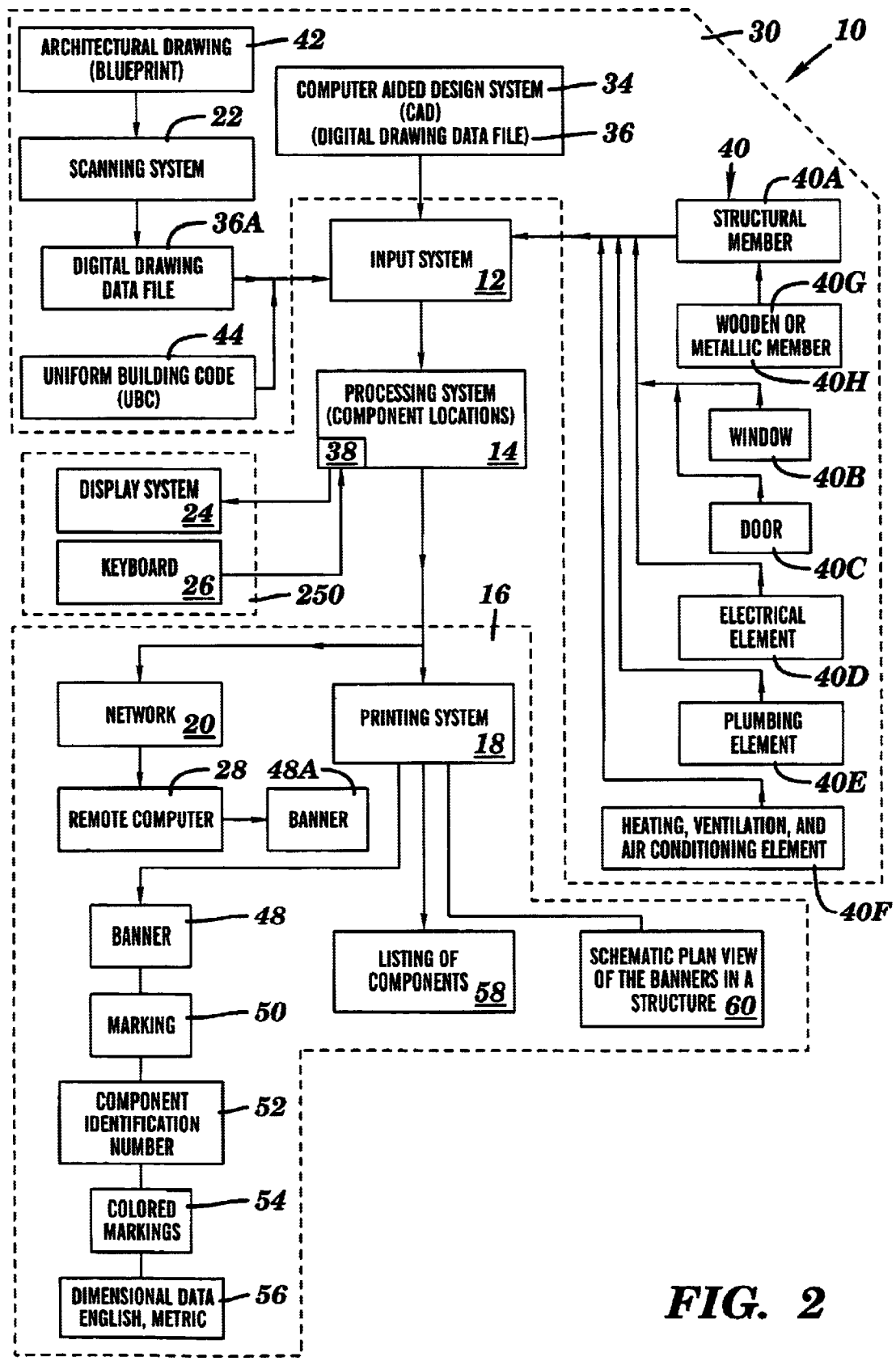
FIG. 2 illustrates a schematic view of a flow chart of the automated layout system.

FIG. 2 illustrates a schematic view of a flow chart of the automated layout system 10. A designer creates an architectural design 30 of a structure 32 (FIG. 7). The structure 32 may be, for example, a wall of a residential building, an office building, a warehouse, etc. The architectural design 30 may be generated using a Computer Aided Design System (CAD)34. The CAD system 34 converts the architectural design 30 into a digital drawing data file 36. The digital drawing data file 36 is sent to the input system 12. From the input system 12 the digital drawing data file 36 is sent to the processing system 14. The processing system 14 may include a computer 38. The computer 38 may include a display system 24 (FIG. 1) for displaying information transmitted from the computer 38. The computer 38 may include any suitable device, for example, a keyboard 26 or mouse, for enabling an operator to send commands to the computer 38. The display system 24 and the keyboard 26 may be included in a workstation 250.

The architectural design 30 includes component 40 information. The component 40 information may include a structural member 40A, a window 40B, a door 40C, an electrical element 40D, a plumbing element 40E, and a heating, ventilation, air conditioning element 40F, etc. The structural member 40A may include a wooden member 40G a metallic member 40H, or other building material of the structure 32. The component 40 information is transmitted through the input system 12 to the processing system 14.

The architectural design 30 may include an architectural drawing 42, such as a blueprint. The architectural drawing 42 may be fed through a scanning system 22. The scanning system 22 generates a digital drawing data file 36A that is transmitted through the input system 12 into the processing system 14.

The architectural design 30 may include Uniform Building Code (UBC) 44 data that is transmitted through the input system 12 into the processing system 14. The UBC 44 data contains local building code standards that a structure must meet. These standards include, for example, structural member 40A thickness dimensions and spacings.

The processing system 14 combines the component 40 information, the digital drawing data file 36, 36A, and the UBC 44 data. The processing system 14 calculates and generates the dimensional location for each of the component 40 (e.g., structural member 40A, window 40B, door 40C, electrical element 40D, plumbing element 40E, heating, ventilation, air conditioning element 40F, etc.) within the structure 32. The dimensional location of each component 40 is digitized and automatically transferred to the output system 16.

The output system 16 may send the digitized dimensional location of each component 40 to a network 20. The network 20 may be, e.g., an internet connection, a computer network, etc. The network 20 may transmit digitized dimensional location information for each component 40 to a remote computer system 28. The remote computer system 28 may be used to output a banner 48A. Additionally, the output system 16 may store the digitized location for each component 40 on any suitable storage media (e.g., hard disk, floppy disk, tape, etc.). The storage media may then be transported and inserted into the remote computer system 28. The remote computer system 28 may be used to output the banner 48A.

The output system 16 sends the digitized dimensional location of each component 40 to the printing system 18. The printing system 18 prints a banner 48. The banner 48 is a full size template including a plurality of markings 50, a plurality of component identification numbers 52, colored markings 54, dimensional data 56 (e.g., English, Metric, etc.)and so on. The banner 48 may be made from any suitable durable waterproof sheet material, for example, TYVEK™ (DuPont), plastic, etc. The TYVEK™ includes spunbonded olefin fibres. The markings 50 show the location for each component 40 of the structure 32 on the banner 48. The markings may be uniformly spaced, for example, at 16 inch intervals to indicate stud spacing. The markings 50 may be colored markings 54 to indicate a component type, such as black for the structural member 40A, red for the electrical element 40D, blue for the plumbing element 40E, and green for the heating, ventilation, and air conditioning element 40F. Identification numbers 52 (e.g., vendor part numbers) may be printed on the banner 48 adjacent to the location of the component such as a window 40B or a door 40C. Dimensional data 56 for structural member 40A lengths may be printed on the banner 48. The dimensional data 56 may be printed in any suitable standard (e.g., English, Metric, etc.). One or more different types of the markings 50 may be pre-printed on the sheet material forming the banner 48 (e.g., by the manufacture of the sheet material of the banner 48, by other manufacturers, or by a printing company, etc.) prior to the banner 48 being printed by the printing system 18. For example, indicia, such as uniformly spaced lines arranged 16" on center, may be pre-printed on the sheet material forming the banner 48.

The printing system 18 may print a listing of components 58. The listing of components 58 includes a printout of all of the components 40 in a structure 32 for each banner 48 within the structure 32. The printing system 18 may print a schematic plan view 60 of the banner 48 locations within the structure 32.

Figure 3:
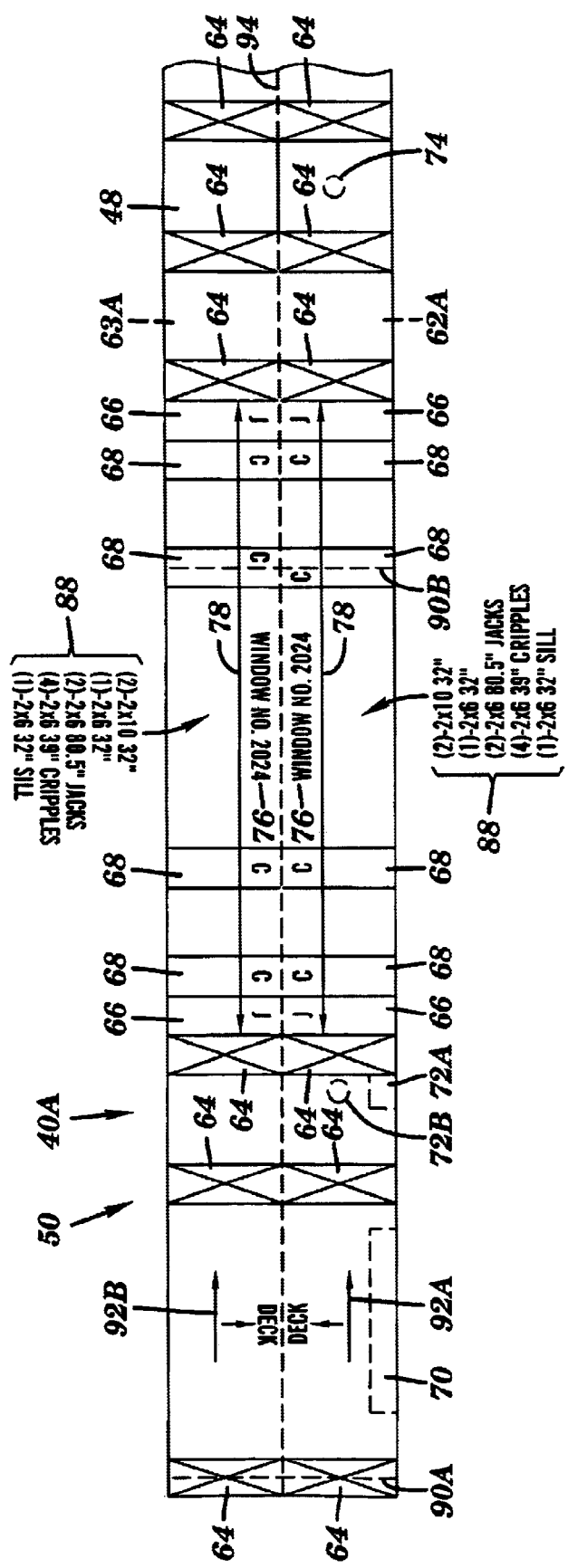
FIG. 3 illustrates a plan view of a banner attached to a first reference component and a second reference component of a structure.

FIGS. 3, 4 and 5 illustrates the banner 48 attached to a first reference component 62A and a second reference component 63A of a structure 32A (FIG. 7). FIG. 3 illustrates a plan view of the banner 48 attached to the first reference component 62A and the second reference component 63A. FIG. 4 illustrates a side view of the banner 48 attached to the first reference component 62A and the second reference component 63A. FIG. 5 illustrates an end view of the banner 48 attached to the first reference component 62A and the second reference component 63A. The first reference component 62A is a bottom plate of the structure 32A and the second reference component 63A is a top plate of the structure 32A as illustrated in FIG. 7. The first reference component 62A and the second reference component 63A are placed adjacent to each other and the banner 48 is attached to the first reference component 62A and the second reference component 63A (FIGS. 3, 4, and 5). The markings 50 on the banner indicate the location of the components 40 such as structural members 40A, the window 40B, the electrical element 40D, the plumbing element 40E, and the heating, ventilation, air conditioning element 40F, etc.

As illustrated in FIG. 3, the markings 50 for structural members 40A include a plurality of stud locations 64, a plurality of jack locations 66, and a plurality of cripple locations 68. Markings 50 include a location 70 for a heating, ventilation, and air conditioning element 40F. Markings 50 include a location 72A and a location 72B for the electrical element 40D. Markings 50 include the location 74 for the plumbing element 40E. FIG. 3 illustrates an identification part number 76 for a window 40B that is printed on the banner 48. Marking 50 includes lines 78 for identifying the location for the window 40B. The lengths and the quantity of the structural members 40A including a plurality of jacks 80, a plurality of cripples 82, a sill 84, a plurality of headers 86, and a header sill 86 are printed 88 onto the banner 48. Markings 50 include dotted lines 90A and 90B spaced 4 feet apart to denote the location for a four foot wide wall board (not shown). Markings 50 include a cut line 94 that is cut by a sharp object such as a knife.

Figure 6:
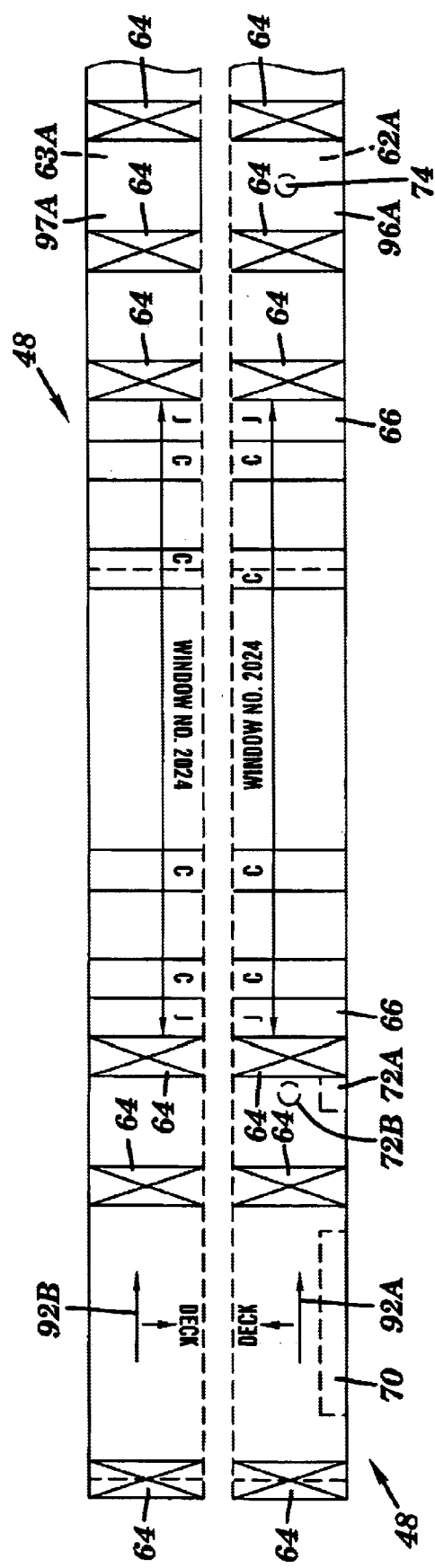
FIG. 6 illustrates a plan view of the banner separated into a first banner portion and a second banner portion.

Cutting along the cut line 94 of the banner 48 separates the first reference component 62A from the second reference component 63A (FIG. 6). Thus, the banner 48 is separated into a first banner portion 96A and a second banner portion 97A. The first banner portion 96A remains attached to the first reference component 62A, and the second banner portion 97A remains attached to the second reference component 63A. The first reference component 62A forms the bottom plate of the structure 32. The second reference component 63A forms the top plate of the structure 32. The markings 50 include a direction arrow 92A printed on the first banner portion 96A, and a direction arrow 92B printed on the second banner portion 97A. The direction arrows 92A and 92B are kept pointing in the same direction when the first reference component 62A and the second reference component 63A are placed into position as bottom 98 and the top 100 of the structure 32.

A plurality of studs 102 are cut to the appropriate selected length and are located and attached to the first reference component 62A and the second reference component 63A at the stud location 64 markings 50 (FIG. 7). The jacks 80, the cripples 82, the sill 84, the headers 86, and the header sill 87 are cut to the lengths as indicated on the printed list 88 on the banner 48 (FIG. 3). The jacks 80 are located and attached to the first reference component 62A as indicated by the jack location 66 markings 50. The cripples 82 are located and attached to the first reference component 62A as indicated by the cripple location 68 markings 50. The sill 84 is attached to the cripples 82 and jacks 80. The header sill 87 is attached to the jacks 80. The headers 86 are attached to the studs 102 and the second reference component 63A. The jacks 80, the sill 84 and the header sill 87 form a window opening 104.

FIG. 7 illustrates a heating, ventilation, and air conditioning element 40F positioned at the marking 50 location 70. The heating, ventilation, and air conditioning element 40F may be any component (e.g., supply duct, return duct, etc.). The electrical element 40D is positioned at the 72A and 72B marking 50 locations. The electrical element 40D may be any electrical component (e.g., outlet, wire, switch, etc.). The plumbing element 40E is positioned at the marking 50 location 74. The plumbing element 40E may be any plumbing component (e.g., cold water pipe, hot water pipe, drain pipe, etc.).

Figure 8:
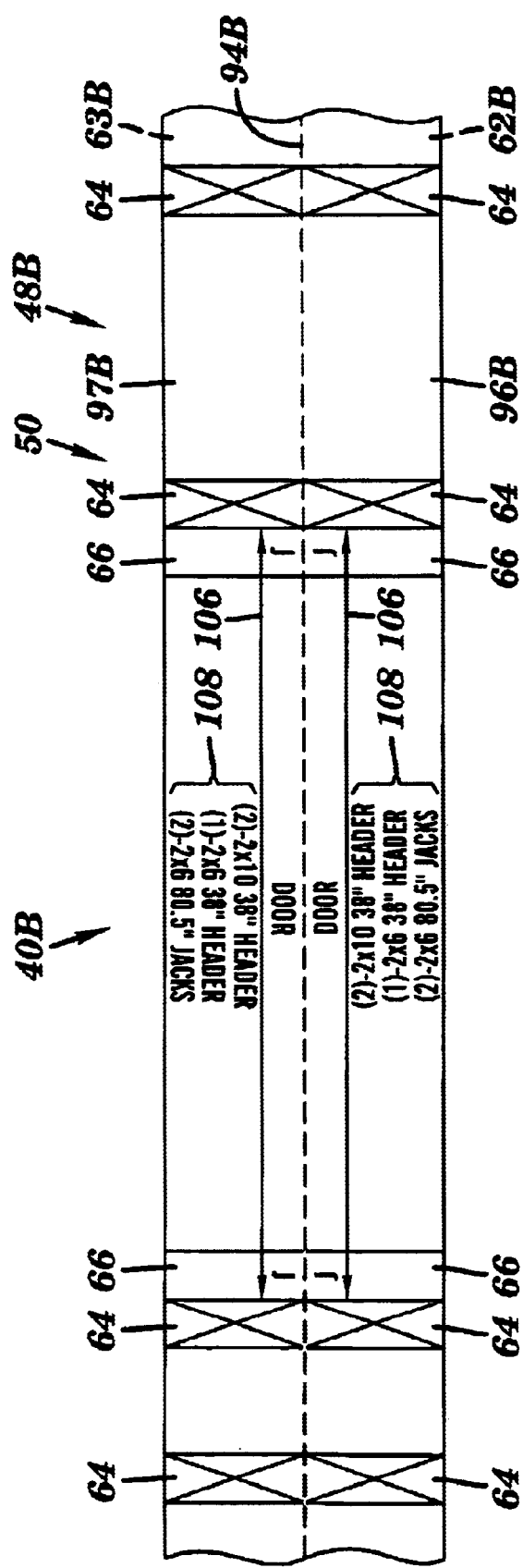
FIG. 8 illustrates another embodiment of a banner including a door opening.

FIG. 8 illustrates another embodiment of a banner 48B. The banner 48B includes markings 50 for stud locations 64 and a plurality of jack locations 66. Marking 50 includes lines 106 for identifying the location for the door 40C. The lengths and the number of structural members 40B including a plurality of jacks 80B, a plurality of headers 86B, and a header sill 87B are printed 108 on the banner 48B. The banner 48B is attached to a first reference component 62B and a second reference component 63B. The markings 50 include a cut line 94B that is cut by the knife.

Figure 9:
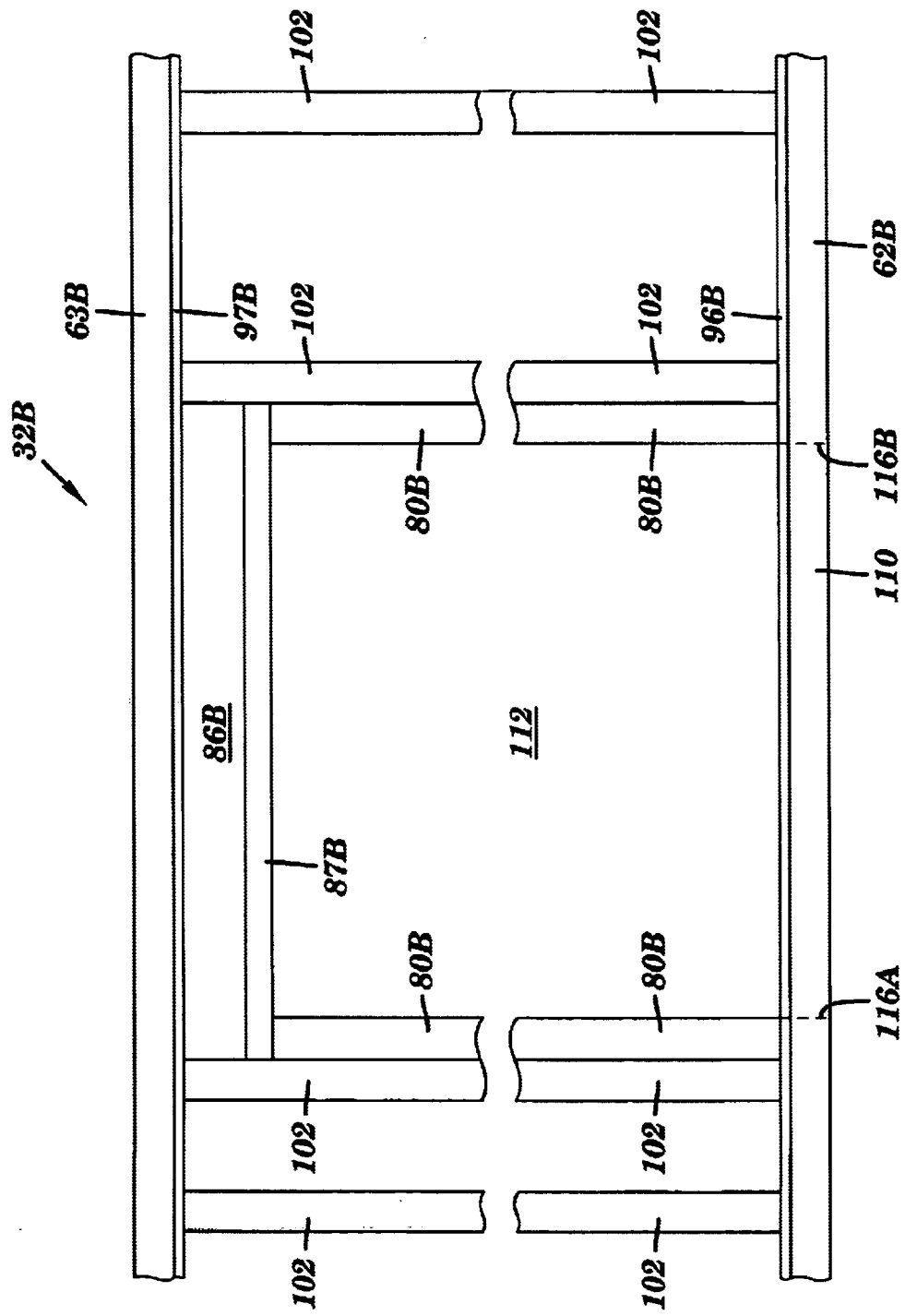
FIG. 9 illustrates a side view of a framed wall of a structure including the door opening.

Similar to the banner 48, cutting along the cut line 94B of banner 48B separates the first reference component 62B from the second reference component 63B. The banner 48B is separated into a first banner portion 96B and a second banner portion 97B. The first banner portion 96B remains attached to the first reference component 62B, and the second banner portion 97B remains attached to the second reference component 63B. The first reference component 62B is a bottom plate of the structure 32B and the second reference component 63B is a top plate of the structure 32B as illustrated in FIG. 9.

A plurality of studs 102 are cut to a uniform selected length and are located and attached to the first reference component 62B and the second reference component 63B at stud location 64 markings 50. The jacks 80B, the header sill 87B, and the headers 86B are cut to the lengths as indicated on the printed list 108 on the banner 48B (FIG. 8). The jacks 80B are located and attached to the first reference component 62B as indicated by the jack location 66 markings 50. The header sill 87B is attached to the jacks 80B. The headers 86B are attached to the studs 102 and the second reference component 63B. After the structure 32B is erected, cuts 116A and 116B are made through the first reference component 62B. Then a portion 110 of the first reference component 62B is removed from the door opening 112.

Figure 10:
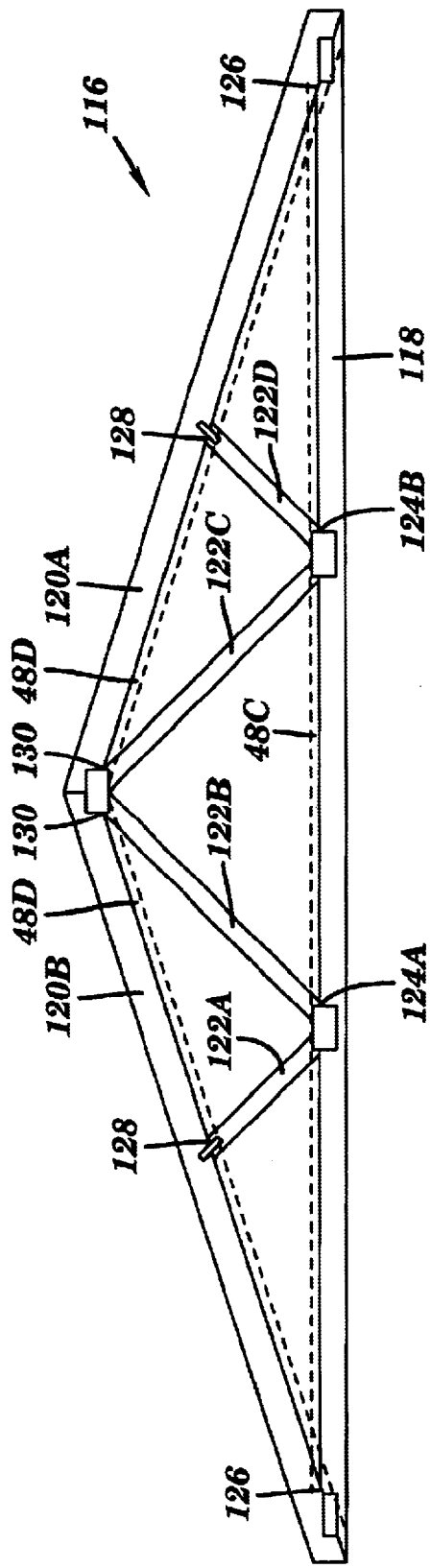
FIG. 10 illustrates a side view of a roof truss.
Figure 11:
FIG. 11 illustrates another embodiment of a banner for a bottom chord of the roof truss.

FIG. 10 illustrates a side view of a roof truss assembly 116. The roof truss assembly includes a bottom chord 118, a top chord 120A, a top chord 120B, and a plurality of web members 122A–122D. FIG. 11 illustrates a banner 48C that attaches to a bottom chord 118 of the roof truss assembly 116. The banner 48C is attached to the bottom chord 118 and is used to locate the web members 122A and 122B at the location 124A, and the web members 122C and 122D at the location 124B.

Figure 12:
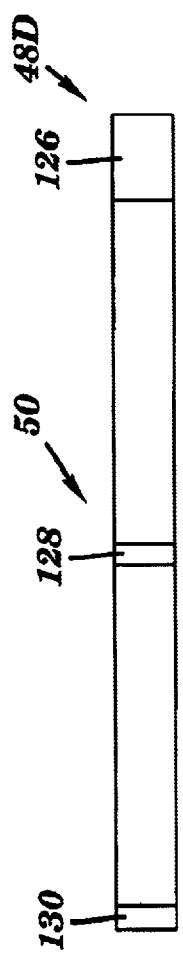
FIG. 12 illustrates a banner for a top chord of a the roof truss.

As illustrated in FIG. 12, a banner 48D includes markings 50 for a location 126, a location 128, and a location 130. A first copy of the banner 48D is attached to the top chord 120A, and a second copy of the banner 48D is attached to the top chord 120B. For the top chord 120A, the location 126 positions the top chord 120B with the bottom chord 118, the location 128 positions the top chord 120A with the web member 122D, and the location 130 positions the top chord 120A with the web member 122C. For the top chord 120B, the location 126 positions the top chord 120B with bottom chord 118, the location 128 positions the top chord 120B with the web member 122A, and the location 130 positions the top chord 120B with the web member 122B.

FIG. 13 illustrates a side view of a gable end 132. The gable end 132 includes a bottom plate 134, a rafter 136A and a rafter 136B, and a plurality of studs 138A–138K. A banner 48E is illustrated in FIG. 14. The banner 48E includes location 142A–142K markings 50 corresponding to the locations for the studs 138A–138K. A location 144A marking 50 and a location 144B marking 50 corresponds to the position of the rafter 136A and the rafter 136B. The banner 48E is attached to the base plate 134. A banner 48F is illustrated in FIG. 15. The banner 48F includes location 146A–146E and location 148 markings 50. A first copy of the banner 48F is attached to the rafter 136A and a second copy of the banner 48F is attached to the rafter 136B. The markings on the banner 48F on rafter 136A locate the studs 138G–138K and the base plate 134. The markings on the banner 48F on rafter 136B locate the studs 138A–138E and the base plate 134.

Figure 16:
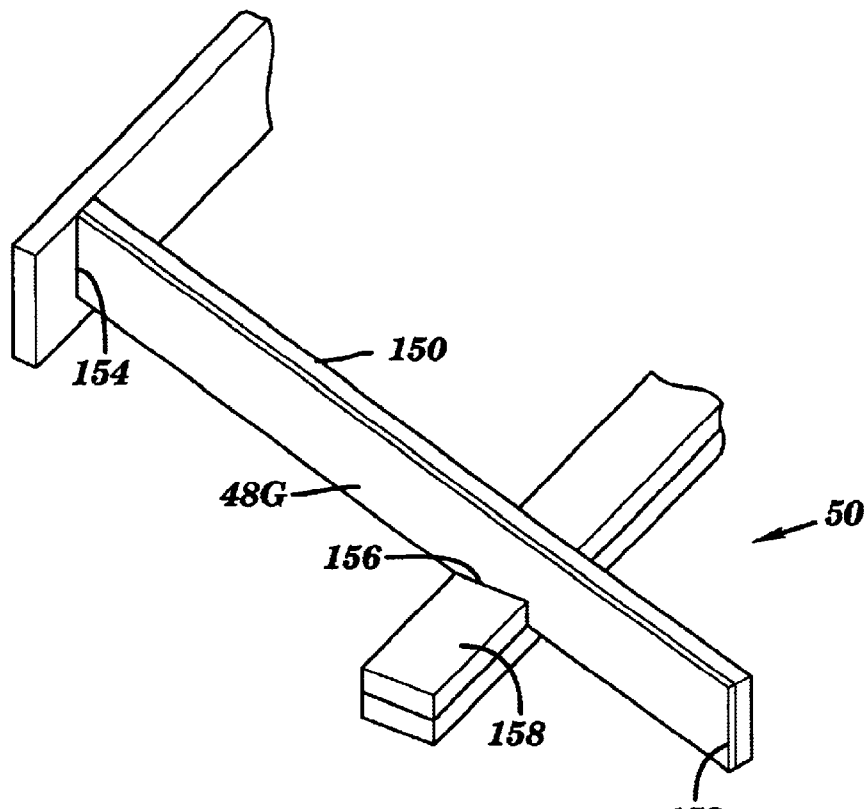
FIG. 16 illustrates a perspective view of a rafter member of the structure.

FIG. 16 illustrates a perspective view of a rafter member 150. A banner 48G is attached to the rafter member 150. The banner 48G provides a full size template so that the rafter member 150 has been cut to conform to the banner 48G shape. The banner 48G includes markings 50 for an end cut 152, an end cut 154, and a "bird's mouth" cut 156. The "bird's mouth" cut 156 allows the rafter member 150 to accept a double top plate 158.

Figure 17:
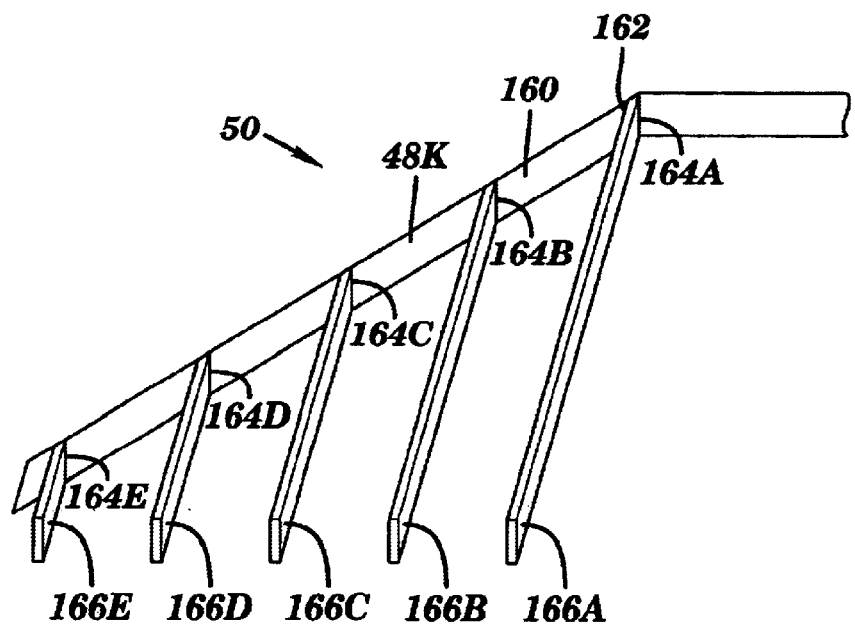
FIG. 17 illustrates a perspective view of a hip rafter member of the structure.

FIG. 17 illustrates a perspective view of a hip rafter member 160. A banner 48K is attached to the hip rafter member 160. The banner 48K provides a full size template so that the hip rafter member 160 has been cut to conform to the banner 48K shape. The banner 48K includes markings 50 for an end cut 162, and for a plurality of locations 164A–164E. The plurality of locations 164A–164E position a plurality of hip jack rafters 166A–166E, respectively.

Figure 18:
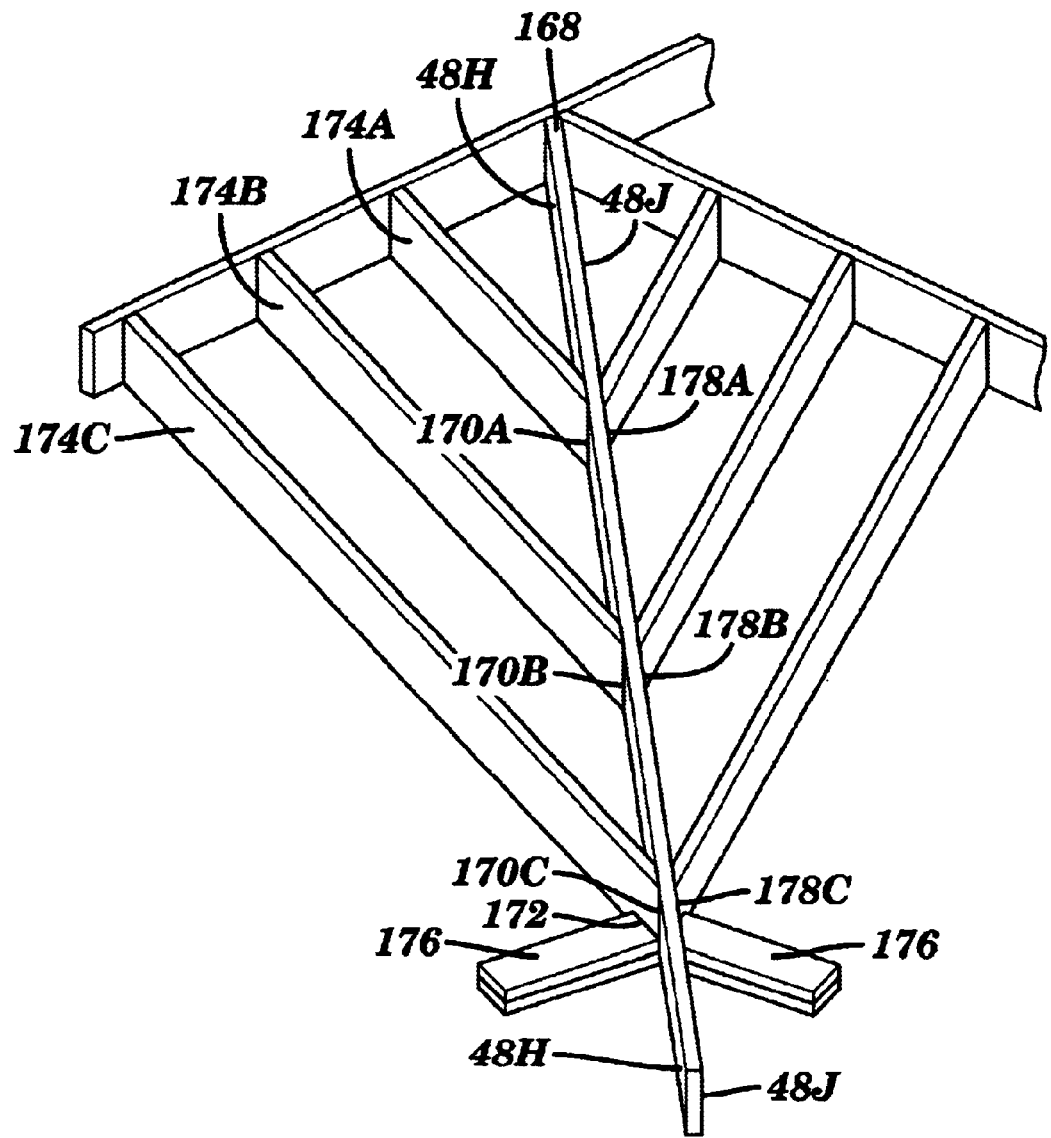
FIG. 18 illustrates a perspective view of a valley rafter member of the structure.

FIG. 18 illustrates a perspective view of a valley rafter member 168. A banner 48H and a banner 48J are attached to the rafter member 168. The banner 48H and the banner 48J provide full size templates onto the rafter member 168 and the rafter member 168 has been cut to conform to the shapes of the banner 48H and the banner 48J. The banner 48H includes markings 50 for a plurality of locations 170A–170C, and for a "bird's mouth cut" 172. The plurality of locations 170A–170C position the valley jack rafters 174A–174C. The "bird's mouth cut" 172 accepts the double top plate 176. The banner 48J includes markings 50 for a plurality of locations 178A–178C, and for the "bird's mouth cut" 172. The plurality of locations 178A–178C position a plurality of valley jack rafters 180A–180C.

Figure 19:
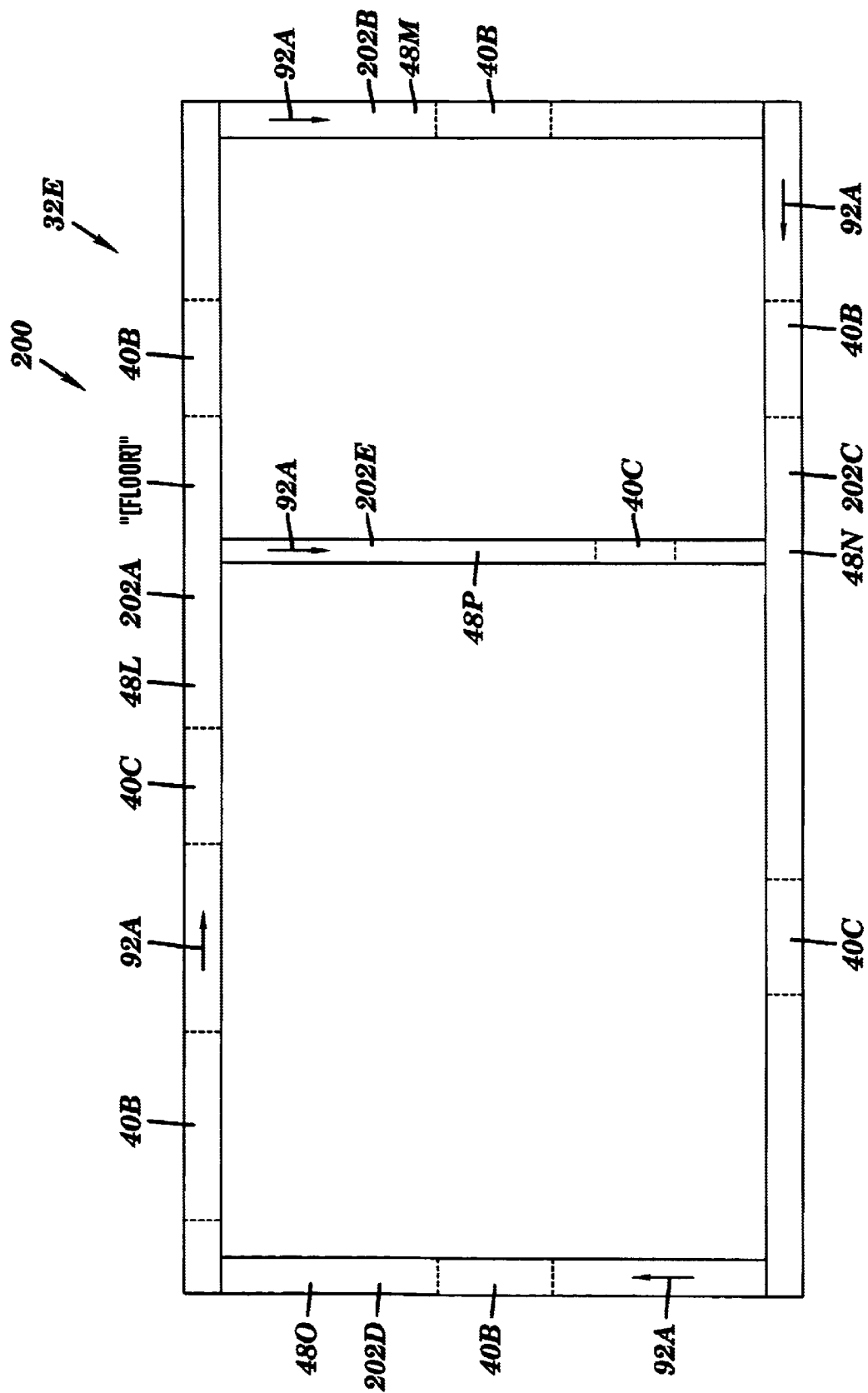
FIG. 19 illustrates a schematic plan view for a builder to determine the locations for each banner.

FIG. 19 illustrates a schematic plan view 200 of a structure 32E such as a building. The printing system 18 (FIG. 2) prints the schematic plan view 200. The schematic plan view 200 includes a plurality of banner locations 202A–202E. Each banner 48L–48P includes a unique banner number that is printed onto each banner 48L–48P and onto the schematic plan view 200. For example, if the banner 48L at location 202A is given a number "1floor1", then "1floor1" is printed onto the banner 48L and also onto the schematic plan view 200. A builder uses the schematic plan view 200 to determine the locations for each banner 48L–48P. The direction arrow 92A (FIG. 3) is printed on each banner 48L–48P. Additionally, the direction arrow 92A is printed onto the schematic plan view 200 for each banner location 202A–220E. The direction arrow 92A allows a builder to position each banner 48L–48P in a proper orientation. Additionally, locations for components 40 such as windows 40B and doors 40C are printed on the schematic plan view 200.

The foregoing description of the present invention has been presented for purposes of illustration and description. It is not intended to be exhaustive or to limit the invention to the precise form disclosed, and many modifications and variations are possible in light of the above teaching. For example, the automated layout system 10 may be used to create banners 48 for any suitable structure (e.g., a residential building, a commercial building, a warehouse, a boat, etc.). Such modifications and variations that may be apparent to a person skilled in the art are intended to be included within the scope of this invention as defined by the accompanying claims.

I claim:

1. An apparatus comprising:
   an input system for acquiring an architectural design of a structure;
   a processing system for converting the architectural design into a plurality of component locations of the structure; and
   an output system for receiving at least one component location from the processing system and for outputting each component location as markings on a banner, the banner being sized to overlay a first surface of an elongated framing element of the structure, the elongated framing element having a rectangular cross section defined by said first surface, an opposite surface and two narrower side surfaces.

2. The apparatus of claim 1, wherein the processing system is a computer.

3. The apparatus of claim 2, wherein the computer further includes a display system.

4. The apparatus of claim 2, wherein the computer further includes a keyboard for inputting commands to the processing system.

5. The apparatus of claim 1, further including a scanning system for receiving an architectural drawing and converting the drawing into digital data and for sending the digital data to the processing system.

6. The apparatus of claim 1, wherein the component is a structural member of the structure.

7. The apparatus of claim 6, wherein the structural member comprises wood, or metal.

8. The apparatus of claim 1, wherein the component is a window.

9. The apparatus of claim 1, wherein the component is a door.

10. The apparatus of claim 2, wherein the component is an electrical element.

11. The apparatus of claim 1, wherein the component is a plumbing element.

12. The apparatus of claim 1, wherein the component is a heating, ventilation, or air conditioning element.

13. The apparatus of claim 1, wherein the output system further includes a printing system for printing markings of at least one component location onto said banner.

14. The apparatus of claim 13, wherein the banner is spunbonded olefin.

15. The apparatus of claim 13, wherein the printing system prints a materials list including quantities and dimensional data onto the banner.

16. The apparatus of claim 15, wherein the dimensional data is in English or Metric units.

17. The apparatus of claim 13, wherein the printing system prints a vendor part number for the component onto the banner.

18. The apparatus of claim 13, wherein the printing system prints a distinguishing color for the component onto the banner.

19. The apparatus of claim 13, wherein the printing system prints a list of each component of the structure.

20. The apparatus of claim 13, wherein the printing system prints a schematic view of the banner locations of the structure.

21. The apparatus of claim 13, further including a fastening apparatus to attach the banner onto the first surface of the elongated framing element of the structure.

22. The apparatus of claim 1, further including a network connection for transferring component location data to a remote computer.

23. A method comprising the steps of:
providing an architectural design of a framing structure;
with a computer aided design system, generating a digitized data file from the architectural design;
with a processing system, converting the digitized data file into a plurality of component locations of the structure; and
marking the location for at least one component of said plurality of component locations onto at least one banner, the banner being sized to overlay a first surface of an elongated reference component of the framing structure, the reference component having a rectangular cross section defined by the first surface, an opposite surface and a pair of narrower side surfaces.

24. The method of claim 23, further including the step of attaching the at least one banner onto said first surface of the reference component of the structure.

25. The method of claim 24, further including the step of positioning the at least one component onto the marked location on the at least one banner, and attaching the at least one component to the first surface of the reference component of the structure.

26. The method of claim 23, further including the step of inputting a uniform building code into the processing system for converting the digitized data file into a plurality of component locations meeting the uniform building code.

27. The method of claim 23, further including the step of inputting at least one heating, ventilation, or air conditioning component location into the processing system.

28. The method of claim 23, further including the step of inputting at least one plumbing component location into the processing system.

29. The method of claim 23, further including the step of inputting at least one electrical component location into the processing system.

30. The method of claim 23, further including the step of providing a scanning system for receiving an architectural drawing and converting the drawing into digital data and for transmitting the digital data into the processing system.

31. The method of claim 23, further including the step of providing a listing of each component of the structure.

32. The method of claim 23, further including the step of providing a schematic view of the banner locations of the structure.

33. The method of claim 23, further including the step of transmitting component location information to a network.

34. The method of claim 33, further including the step of transmitting component location information from the network to a remote computer.

35. A banner sized to overlay an elongated framing element of a building structure, comprising:
an elongated sheet of material;
a plurality of marks on the elongated sheet of material for indicating a location for at least one component of said structure, and wherein the plurality of marks are colored;
a component identification number printed onto the elongated sheet of material; and
a list of component quantities and dimensional information printed onto the elongated sheet of material.

36. The banner of claim 35, wherein the marks are uniformly spaced along the banner.

37. The banner of claim 35, wherein the sheet of material is spunbonded olefin.

38. The banner of claim 35, wherein the component identification number comprises a vendor part number.

39. The banner of claim 35, wherein the elongated framing element has a rectangular cross section defined by a first surface, a second surface opposite said first surface, and a pair of narrower side surfaces, and wherein the banner is sized to overlay said first surface.

* * * * *